(12) United States Patent
Zhou et al.

(10) Patent No.: US 6,969,690 B2
(45) Date of Patent: *Nov. 29, 2005

(54) METHODS AND APPARATUS FOR PATTERNED DEPOSITION OF NANOSTRUCTURE-CONTAINING MATERIALS BY SELF-ASSEMBLY AND RELATED ARTICLES

(75) Inventors: Otto Z. Zhou, Chapel Hill, NC (US); Soojin Oh, Chapel Hill, NC (US); Jian Zhang, Carrboro, NC (US); Yuan Cheng, Chapel Hill, NC (US); Hideo Shimoda, Chapel Hill, NC (US)

(73) Assignee: The University of North Carolina at Chapel Hill, Chapil Hill, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/803,639

(22) Filed: Mar. 18, 2004

(65) Prior Publication Data

US 2004/0241896 A1 Dec. 2, 2004

Related U.S. Application Data

(60) Provisional application No. 60/456,254, filed on Mar. 21, 2003.

(51) Int. Cl.[7] .......................................... H01L 21/469
(52) U.S. Cl. ...................... 438/787; 438/790; 438/678
(58) Field of Search ................................ 438/678, 478, 438/20, 787–790, 750

(56) References Cited

U.S. PATENT DOCUMENTS

| | | | |
|---|---|---|---|
| 6,277,318 B1 | 8/2001 | Bower et al. | |
| 6,280,697 B1 | 8/2001 | Zhou et al. | |
| 6,334,939 B1 | 1/2002 | Zhou et al. | |
| 6,401,526 B1 | 6/2002 | Dai et al. | |
| 6,422,450 B1 * | 7/2002 | Zhou et al. | 219/121.85 |
| 6,457,350 B1 | 10/2002 | Mitchell | |
| 6,553,096 B1 | 4/2003 | Zhou et al. | |
| 6,630,772 B1 | 10/2003 | Bower et al. | |
| 6,787,122 B2 | 9/2004 | Zhou | |
| 6,876,742 B1 | 4/2005 | Sacca | |
| 2002/0140336 A1 | 10/2002 | Stoner et al. | |
| 2002/0193040 A1 | 12/2002 | Zhou | |

(Continued)

OTHER PUBLICATIONS

R. Stevens et al., "Improved fabrication approach for carbon nanotube probe devices", *Appl. Phys. Lett.*, vol. 77, No. 21, Nov. 20, 2000, pp. 3453-3455.

(Continued)

*Primary Examiner*—Dung A. Le
(74) *Attorney, Agent, or Firm*—Buchanan Ingersoll PC (57) ABSTRACT

Methods and apparatus are described for patterned deposition of nanostructure-containing materials by self-assembly and related articles. According to an exemplary embodiment self-assembly method for depositing nanostructure-containing materials includes forming a nanostructure-containing material. The nanostructure-containing material is chemically functionalized and dispersed in a liquid medium to form a suspension. At least a portion of a substrate having a surface that can attract the functionalized nanostructure-containing material is brought into contact with the suspension. The substrate is separated from the suspension. The nanostructure-containing material adheres to the portion of the substrate when separated from the suspension. According to another exemplary embodiment, hydrophilic and hydrophobic regions are formed on the surface of the substrate before bringing the substrate into contact with the suspension. The functionalized nanostructure-containing material is hydrophilic and adheres to the hydrophilic region of the substrate when separated from the suspension.

28 Claims, 9 Drawing Sheets

Clean glass or ITO coated glass → Substrate submersed in CNT/water suspension → CNT deposits on substrate as water evaporates

U.S. PATENT DOCUMENTS

2003/0102222 A1    6/2003   Zhou et al.
2003/0180472 A1 *  9/2003   Zhou et al.  .............. 427/430.1
2004/0173378 A1    9/2004   Zhou et al.

OTHER PUBLICATIONS

J. Hafner et al., "Growth of nanotubes for probe microscopy tips", *Nature*, vol. 398, Apr. 29, 1999, pp. 761-762.

H. Dai et al., "Nanotubes as nanoprobes in scanning probe microscopy", *Nature*, vol. 384, Nov. 14, 1996, pp. 147-150.

Bower et al., U.S. Appl. No. 09/351,537 filed Jul. 1, 1999 entitled "Device Comprising Thin Film Carbon Nanotube Electron Field Emitter Structure".

* cited by examiner

Clean glass or ITO coated glass

Substrate submersed in CNT/water suspension

CNT deposits on substrate as water evaporates

Paterned glass or ITO coated glass with hydrophobic film

Substrate submersed in CNT/water suspension

CNT deposits on hydrophobic area of patterned substrate

METHODS AND APPARATUS FOR PATTERNED DEPOSITION OF NANOSTRUCTURE-CONTAINING MATERIALS BY SELF-ASSEMBLY AND RELATED ARTICLES

RELATED APPLICATIONS

This application claims the benefit of U.S. Provisional Application No. 60/456,254, titled "Methods for Low-Temperature Assembly of Nanostructure-Containing Materials and Related Articles", filed on Mar. 21, 2003, which is incorporated here by reference in its entirety.

STATEMENT REGARDING FEDERALLY SPONSORED RESEARCH OR DEVELOPMENT

At least some aspects of this invention were made with Government support under contract nos. N00014-98-1-05907 and NAG-1-01061. The Government may have certain rights in this invention.

BACKGROUND

In the description of the background that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

The term "nanostructure" material is used by those familiar with the art to designate materials including nanoparticles such as $C_{60}$ fullerenes, fullerene-type concentric graphitic particles, metal, compound semiconductors such as CdSe, InP; nanowires/nanorods such as Si, Ge, $SiO_x$, $GeO_x$, or nanotubes single or multi-walled composed of either single or multiple elements such as carbon, $B_xN_y$, $C_xB_yN_z$, $MoS_2$, and $WS_2$. One of the common features of nanostructure materials is their basic building blocks. A single nanoparticle or a carbon nanotube has a dimension that is less than 500 nm at least in one direction. These types of materials have been shown to exhibit certain properties that have raised interest in a variety of applications and processes.

U.S. Pat. Nos. 6,280,697 and 6,422,450 to Zhou et al. (both entitled "Nanotube-Based High Energy Material and Method"), the disclosures of which are incorporated herein by reference, in their entirety, disclose the fabrication of carbon-based nanotube materials and their use as a battery electrode material.

U.S. Pat. No. 6,630,772 entitled "Device Comprising Carbon Nanotube Field Emitter Structure and Process for Forming Device", the disclosure of which is incorporated herein by reference, in its entirety, discloses a carbon nanotube-based electron emitter structure.

U.S. patent application Ser. No. 09/351,537 entitled "Device Comprising Thin Film Carbon Nanotube Electron Field Emitter Structure", the disclosure of which is incorporated herein by reference, in its entirety, discloses a carbon-nanotube field emitter structure having a high emitted current density.

U.S. Pat. No. 6,277,318 to Bower et al. (entitled "Method for Fabrication of Patterned Carbon Nanotube Films"), the disclosure of which is incorporated herein by reference, in its entirety, discloses a method of fabricating adherent, patterned carbon nanotube films onto a substrate.

U.S. Pat. No. 6,334,939 (entitled "Nanostructure-Based High Energy Material and Method"), the disclosure of which is incorporated herein by reference, in its entirety, discloses a nanostructure alloy with alkali metal as one of the components. Such materials are described as being useful in certain battery applications.

U.S. Pat. No. 6,553,096 entitled "X-Ray Generating Mechanism Using Electron Field Emission Cathode", the disclosure of which is incorporated herein by reference, in its entirety, discloses an X-ray generating device incorporating a nanostructure-containing material.

U.S. Published Patent Application No. US 2002/0140336 (entitled "Coated Electrode With Enhanced Electron Emission And Ignition Characteristics"), the disclosure of which is incorporated herein by reference, in its entirety, discloses an electrode including a first electrode material, an adhesion-promoter, and a carbon nanotube-containing material disposed on at least a portion of the adhesion promoting layer, as well as associated devices incorporating such an electrode.

U.S. Pat. No. 6,787,122 entitled "Method of Making Nanotube-Based Material With Enhanced Field Emission", the disclosure of which is incorporated herein by reference, in its entirety, discloses a technique for introducing a foreign species into the nanotube-based material in order to improve the properties thereof.

U.S. Pat. No. 6,876,274 entitled "Large-Area Individually Addressable Multi-Beam X-Ray System and Method of Forming Same", the disclosure of which is incorporated herein by reference, in its entirety, discloses a structure to generate x-rays having a plurality of stationary and individually electrically addressable field emissive electron sources, such as carbon nanotubes.

U.S. Patent Application No. 2003/0180472 entitled "Method for Assembling Nanoobjects", the disclosure of which is incorporated herein by reference, in its entirety, discloses a technique for the self assembly of a macroscopic structure with preformed nanoobjects, which may be processed to render a desired aspect ratio and chemical functionality.

U.S. Patent Application Publication No. 2004/0173378 entitled "Methods for Assembly of Nanostructure-Containing Materials and Related Articles", the disclosure of which is incorporated herein by reference, in its entirety, describes various electrophoretic-type methods for assembling and attaching nanostructure-containing materials to various objects.

As evidenced by the above, nanostructure materials, especially carbon nanotubes and other nanoobjects having a large aspect ratio (that is, a length that is substantially larger than its diameter), possess promising properties that make them attractive for a variety of applications, such as lighting elements, field emission devices such as flat panel displays, gas discharge tubes for over voltage protection, x-ray generating devices, small conduction wires, sensors, actuators and high resolution probes such as those used in scanning microscopes.

The effective incorporation of nanostructure materials into devices has been hindered by difficulties encountered in the processing of the materials. For example, nanostructured materials can be formed by techniques including laser ablation, arc discharge methods, solution synthesis, chemical etching, molecular beam epitaxy (MBE), chemical vapor deposition (CVD), and the like. Each of these techniques to assemble the nanostructure materials present their own challenges.

Post-formation methods including screen printing and spraying have been utilized to deposit pre-formed nanoobjects, such as carbon nanotubes, on a substrate. These techniques pose drawbacks as well. For example, screen printing can require the use of binder materials as well as an activation step, which can result in a relatively low-resolution deposition of material. Spraying can be inefficient and often is not practical for large-scale fabrication. Moreover, screen printing and spraying can result in the nanostructure materials being randomly distributed on the substrate.

Carbon nanotubes have been grown directly upon substrates using of CVD techniques. See, for example, J. Hafner et al., Nature, Vol. 398, pg. 761, 1999; U.S. Pat. No. 6,457,350; and U.S. Pat. No. 6,401,526. One potential application of this technique is the formation of conducting wires made from nanostructure materials, such as electrical circuitry comprised of carbon nanotubes. The CVD process can be used to form the carbon nanotubes that can then be attached to electrodes at specific locations using CVD techniques to form the conducting wires. These techniques can require reactive environments at relatively high temperatures (for example, about 600° C.–1,000° C.) and the use of catalysts to effectively grow the nanotubes. The requirement for such harsh environmental conditions severely limits the types of substrate materials that can be utilized. In addition, the CVD technique often results in multi-walled carbon nanotubes. These multi-walled carbon nanotubes generally do not have the same level of structural perfection as single-walled nanotubes, and thus can have inferior electronic emission properties when compared to single-walled carbon nanotubes.

Other fabrication techniques involving nanostructured materials include precisely controlling the deposition of individual or small groups of nanoobjects, such as carbon nanotubes, onto a substrate to form sharp tips or projections. See, for example, Dai, Nature, Vol. 384, pgs. 147–150 (1996); and R. Stevens et al., Appl. Phys. Lett., Vol. 77, pg. 3453, 2000. These techniques can be challenging to carry out in a large-scale production or batch process.

SUMMARY

Accordingly, methods and apparatus are disclosed for patterned deposition of nanostructure-containing materials by self-assembly and related articles According to an exemplary embodiment self-assembly method for depositing nanostructure-containing materials includes forming a nanostructure-containing material. The nanostructure-containing material is chemically functionalized and dispersed in a liquid medium to form a suspension. At least a portion of a substrate having a surface that can attract the functionalized nanostructure-containing material is brought into contact with the suspension. The substrate is separated from the suspension. The nanostructure-containing material adheres to the portion of the substrate when separated from the suspension.

According to another exemplary embodiment, a material is formed comprising carbon nanotubes. The carbon nanotubes chemically functionalizing and dispersed in a liquid medium to form a suspension. Hydrophilic and hydrophobic regions are formed on a surface of a substrate that can attract the functionalized carbon-nanotubes. At least a portion of the substrate is brought into contact with the suspension. The substrate is separated from the suspension. The carbon nanotubes adhere to the hydrophilic region of the substrate when separated from the suspension.

According to yet another exemplary embodiment, an apparatus is described for depositing nanostructure-containing materials on a substrate including means for forming a nanostructure-containing material. The apparatus includes means for chemically functionalizing the nanostructure-containing material. Additional means is included for dispersing the functionalized nanostructure-containing material in a liquid medium to form a suspension. The apparatus includes means for bringing at least a portion of the substrate having a surface that can attract the functionalized nanostructure-containing material into contact with the suspension. Means for separating the substrate from the suspension is included in the apparatus.

BRIEF DESCRIPTION OF THE DRAWINGS

The accompanying drawings provide visual representations which will be used to more fully describe the representative embodiments disclosed here and can be used by those skilled in the art to better understand them and their inherent advantages. In these drawings, like reference numerals identify corresponding elements, and:

FIG. 1 illustrates (A) transmission electron micrographs of processed single-walled carbon nanotubes having average bundle lengths of about 1–2 $\mu$m, and (B) Raman spectrum of processed single-walled carbon nanotubes showing the characteristic breathing and tangential modes;

FIG. 3 illustrates optical microscope images of single-walled carbon nanotubes deposited on (A) glass and (B) aluminum surfaces according to an exemplary embodiment;.

DETAILED DESCRIPTION

Methods performed consistent with the principles of the present invention, and according to preferred embodiments, along with corresponding structures and devices, are described as follows.

Generally, techniques for low-temperature fabrication of nanostructure-containing materials according to exemplary embodiments can include at least some or all of the following steps: (1) forming a nanostructure-containing material, such as a material including single-walled carbon nanotubes; (2) chemically functionalizing the nanostructure-containing material; (3) dispersing the functionalized nanostructure-containing material in a liquid medium to form a suspension; (4) bringing at least a portion of the substrate having a surface that can attract the functionalized nanostructure-containing material into contact with the suspension; (5) separating the substrate from the suspension; (6) forming hydrophilic and hydrophobic regions on the surface of the substrate before bringing the substrate into contact with the suspension; (7) purifying the nanostructure-containing material; (8) annealing the nanostructure-containing material; and (9) removing the hydrophobic regions from the substrate.

An exemplary fabrication method begins with pre-formed raw nanostructure-containing material, preferably material with a high aspect ratio, or a nanotube-containing material, such as a carbon nanotube-containing material. This raw material can comprise at least one of single-walled carbon nanotubes, multi-walled carbon nanotubes, silicon, silicon oxide, germanium, germanium oxide, carbon nitrides, boron, boron nitride, dichalcogenide, silver, gold, iron, titanium oxide, gallium oxide, indium phosphide, or magnetic particles such as Fe, Co, and Ni enclosed within nanostructures. According to a preferred embodiment, the raw carbon nanotube-containing material comprises single-walled carbon nanotubes. The carbon nanotubes can be formed by means including apparatus for performing laser ablation, arc discharge apparatus and methods, solution synthesis tools, chemical etching tools, molecular beam epitaxy (MBE) tools, chemical vapor deposition (CVD) tools, and the like.

The raw nanostructure-containing material can be in the form of nanotube structures with a composition of $B_xC_yN_z$ (B=boron, C=carbon, and N=nitrogen), or nanotube or concentric fullerene structures with a composition $MS_2$ (M=tungsten, molybdenum, or vanadium oxide) can be utilized. Again, these raw materials can be formed by any suitable technique, such as the above-mentioned arc-discharge technique.

The raw nanostructure-containing material can be subjected to purification after formation. There are a number of techniques for purifying the raw materials. According to one preferred embodiment, the raw material can be purified using a reflux reaction in a suitable solvent, such as a combination of peroxide ($H_2O_2$) and water. The $H_2O_2$ concentration can be 1–40% by volume, preferably about 20% by volume $H_2O_2$, with subsequent rinsing in $CS_2$, then methanol, followed by filtration. According to an exemplary technique, approximately 10–100 ml of $H_2O_2$ is introduced into the medium for every 1–10 mg of nanotubes in the medium, and the reflux reaction is carried out at a temperature of 20° C.–100° C. (see, for example, U.S. Pat. No. 6,553,096.

According to another exemplary embodiment, the raw nanostructure-containing material can be purified by suspending the material in a suitable liquid medium, such as an acidic medium, an organic solvent, or an alcohol, preferably methanol. The raw materials can be kept in suspension within the liquid medium for several hours using a high-powered ultrasonic horn, while the suspension is passed through a microporous membrane. In another embodiment, the raw materials can be purified by oxidation in air or in an oxygen environment at a temperature of about 200° C.–700° C. The impurities in the raw materials can be oxidized in such an environment at a faster rate than the nanotubes. In yet another exemplary embodiment, the raw materials can be purified by liquid chromatography to separate the nanotubes (or nanowires) from impurities in the material.

When the nanostructure-containing material includes nanotubes, further processing can be performed to shorten the length of the nanotubes and nanotube bundles prior to deposition on the substrate. For example, the nanotubes can be shortened using a chemical etching or a milling technique.

The raw material nanostructure-containing material is further processed to render the material hydrophilic. For example, the nanostructure-containing material can be chemically functionalized using means, such as reaction tools configured to partially oxidize the nanostructure-containing material with an acid.

According to another exemplary embodiment, the purified raw nanostructure-containing material can be annealed at a suitable temperature, for example, a temperature of about 100° C.–1200° C. According to one preferred embodiment, the annealing temperature can be about 100° C.–600° C. The material can be annealed for a suitable time period, for example, for approximately 1 to 60 minutes. According to another embodiment, the material can be annealed for approximately 1 hour. The material can be annealed in a vacuum environment of about $10^{-2}$ Torr, or can be annealed at even higher vacuum pressures. According to one embodiment, the vacuum pressure can be about $5\times10^{-7}$ Torr.

Figure 1A:
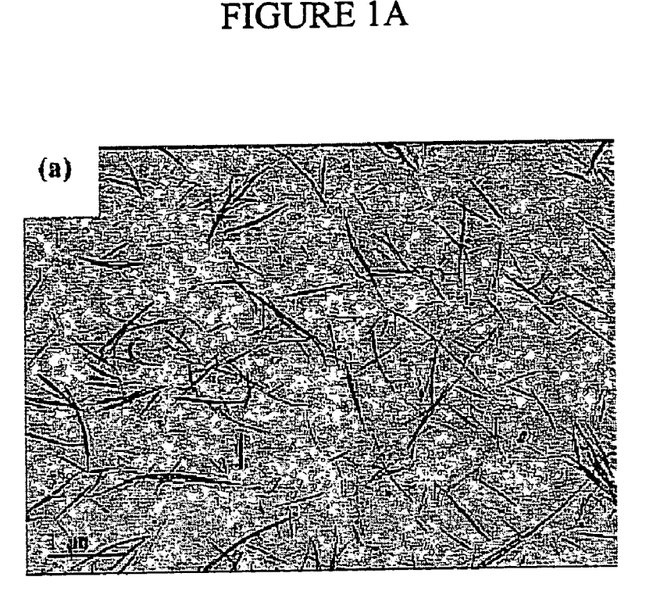
Figure 1B:
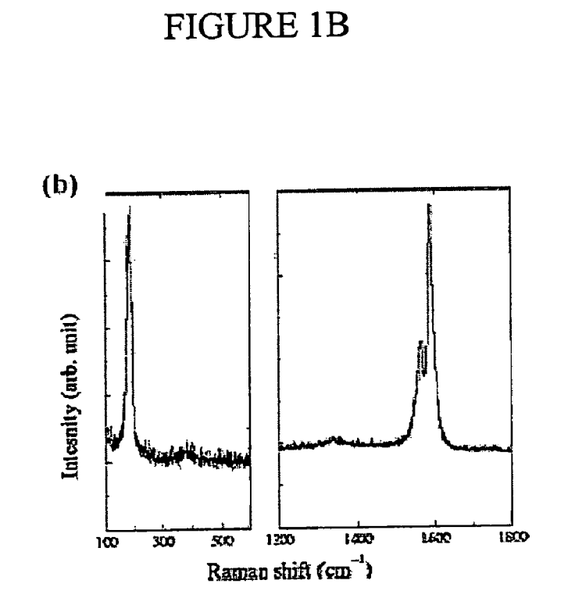

A representative transmission electron microscope (TEM) image of single-walled carbon nanotube bundles processed according to each of the above-described steps is shown in FIG. 1A. As can be seen from the figure, the process steps, including subjecting the material to chemical treatment to render it hydrophilic, did not alter the basic structure of the nanotubes. In addition, FIG. 1B shows that the vibration frequencies of the Raman-active breathing and tangential modes of the nanotubes remain unchanged after such processing. Fourier-transform-infrared (FTIR) spectroscopy indicates that a strong C=0 stretching mode at 1727 cm$^{-7}$, suggesting that defects were created in the processed nanotube-containing material, and that dangling bonds were terminated by COOH groups.

The above described pre-formed and functionalized nanostructure-containing material can now be dispersed in a liquid medium to form a suspension. The suspension can be used to deposit the material onto an object or substrate, and/or to form articles such as conducting wires, and field emission cathodes as will described in detail below.

For example, a suitable liquid medium is selected that will permit the formation of a stable suspension of the raw nanostructure-containing material therein. According to a preferred embodiment the liquid medium comprises water. Upon adding the raw material to the liquid medium, the mixture can optionally be subjected to ultrasonic energy or stirring using, for example, a magnetic stirrer bar, to facilitate the formation of a stable suspension. The amount of time that the ultrasonic energy is applied can vary, but stirring for approximately two hours at room temperature has been found to produce acceptable results. The concentration of raw material in the liquid medium can be varied, so long as a stable suspension can be maintained. For example, the concentration of carbon nanotubes included in the suspension can be in the range of about 0.0001–1 gram of nanotubes per litre of water.

Figure 2:
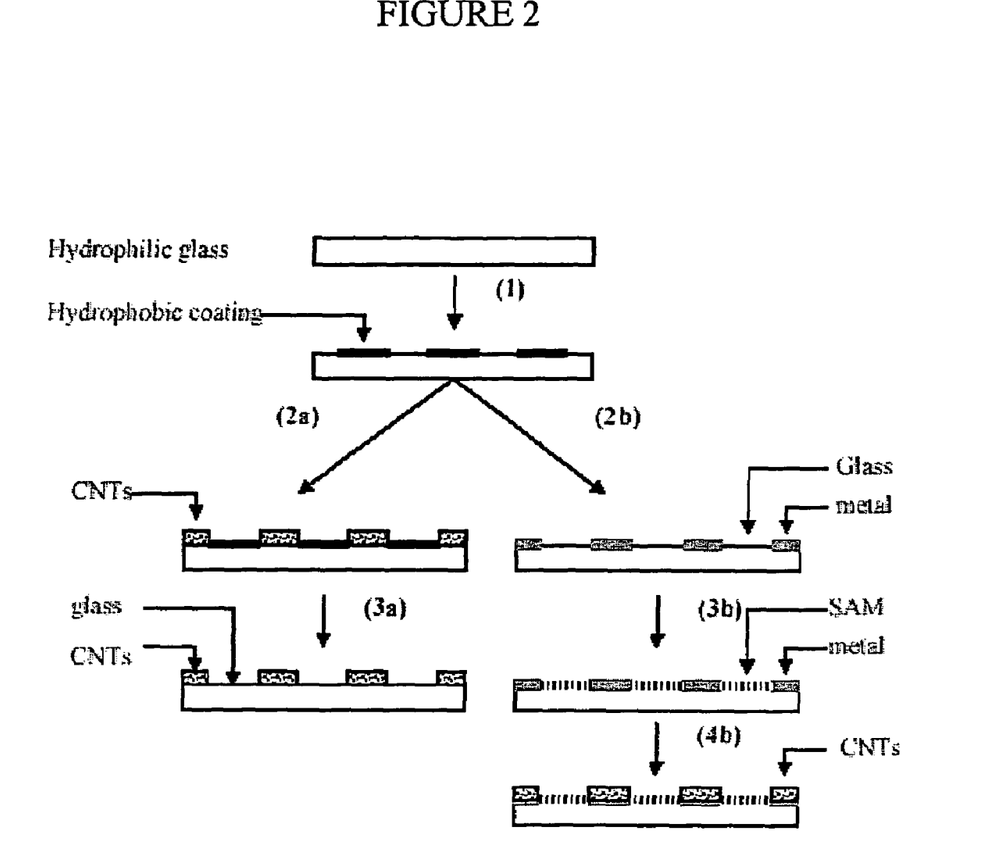
FIG. 2 illustrates low-temperature fabrication processes according to exemplary embodiments.

Once formed, the suspension is used to facilitate the deposition of the nanostructure-containing material on a suitable substrate. FIG. 2 illustrates low-temperature fabrication processes for depositing nanostructure-containing material on a substrate. Preferably, at least a portion of the substrate has hydrophilic properties. The substrate can include silicon, glass, indium-tin-oxide (ITO) coated glass, a metal, such as aluminum or chromium, metal-coated glass, a plastic, or a ceramic. In step (1), a hydrophilic substrate, for example a glass substrate, is patterned with a hydrophobic polymer, for example photoresist such as Shipley 1813. The photoresist can be patterned using photo-lithography techniques, and other methods known to those skilled in the art. According to an exemplary embodiment, the nanostructure-containing material, for example single-walled carbon nanotubes, is deposited on the hydrophilic regions of the substrate (for example, the exposed glass surface) using a self-assembly process as shown in step (2a). The hydrophobic polymer coating is preferably removed in step (3a), for example by washing the coated-substrate in acetone.

In an alternative embodiment, the patterned substrate can be metallized in step (2b), for example by the thermal evaporation of metals such as chromium and aluminum and a photoresist "lift-off" process. In step (3b), octadecyltrichlorosilane (OTS) molecules can be formed on the hydrophilic (hydroxyl terminated) surface of the glass substrate, rendering this portion of the surface hydrophobic. The nanostructure-containing material can then be deposited on the metallized portions of the substrate surface, as shown in step (4).

As shown in FIG. 2, the substrate can be patterned with hydrophobic and hydrophilic regions to define portions of the substrate where the nanostructure-containing material will be deposited. These regions can vary in length and/or width according to the application requirements. For example, controlled line widths varying between 10 $\mu$m and 100 $\mu$m, have been fabricated, but other dimensions can be achieved if required. Different types of substrates are shown in the respective embodiments illustrated in the figure. In the first embodiment illustrated in step (2a), the pattern was created on a hydrophilic substrate such as glass using standard photolithography methods, for example using a printed polymer foil as a photo-mask.

In the second embodiment illustrated in step (2b) the hydrophilic glass substrate is metallized using thermal evaporation and a photoresist "lift-off" process prior to deposition of the nanostructure-containing material. The metallized substrate can then be cleaned, for example, using ultraviolet (UV) ozone cleaning, which is described in detail below. After cleaning, the exposed portions of the glass substrate can be silanized in step (3b) using, for example, an approximate 1 mM OTS mixed solvent solution of hexadecane and tetrachlorocarbon, in a dry box. Silanization of the exposed portions of the glass substrate renders these portions hydrophobic. The prepared substrate can be sonicated, for example in chloroform and ethyl alcohol, prior to deposition of the nanostructure-containing material.

As described above, a homogeneous suspension of the nanostructure-containing material, for example including single-walled carbon nanotubes, can be stabilized in a liquid medium, such as de-ionized water, at a nanotube concentration of up to about 1.0 g/L. At least a portion of a substrate having a surface that can attract the functionalized nanostructure-containing material is brought into contact with the suspension. For example, means such as an apparatus capable immersing the patterned substrate vertically into the suspension can be used at room temperature to bring the portion of the substrate into contact with the suspension.

After bringing the portion of the substrate into contact with the suspension, for example by immersion, the substrate is separated from the suspension allowing the nanotubes to assemble along the water/substrate/air triple-line (see FIG. 4) on the hydrophilic regions of the substrate. Means for separating the substrate from the suspension can include apparatus for withdrawing the substrate from the suspension at a predetermined rate and apparatus for evaporating the liquid, such as a hot plate, while the substrate remains in contact with the suspension. Nanotubes are not found to assemble on the hydrophobic regions of the substrate. As the triple-line moves downward when, for example, either the substrate is withdrawn from the water or the water gradually evaporates, a continuous single-walled carbon nanotube film is formed in the hydrophilic region of the substrate.

The nanotubes adhere strongly to the hydrophilic substrate and cannot be removed by washing in solvents such as methanol, ethanol, and buffered hydrofluoric acid. Thus, the photoresist can be removed using these solvents after the deposition. Bonding of the single-walled carbon nanotubes to the substrate can be attributed to an interaction between the —OH groups present on the glass substrate and the functional groups that terminate the nanotube defect sites.

Figure 3A:
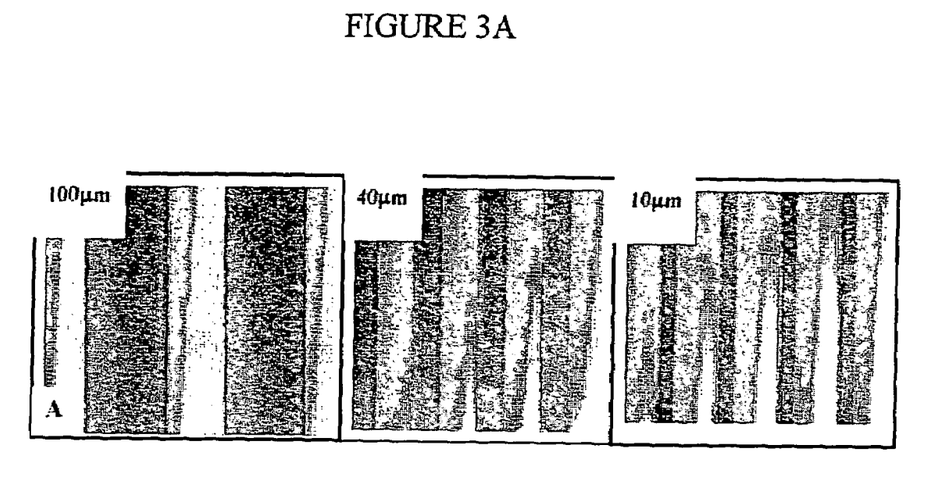
Figure 3B:
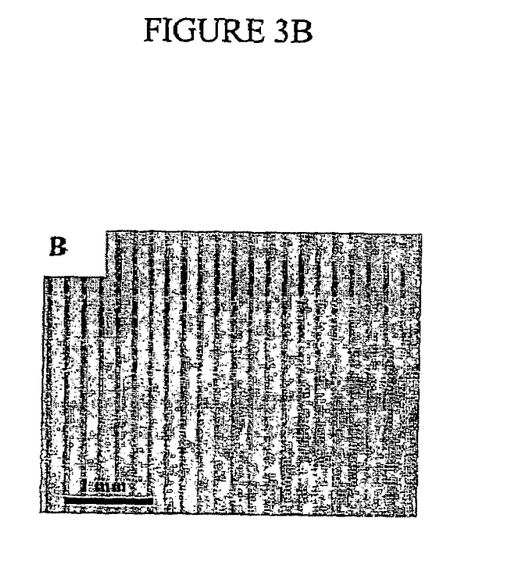

FIGS. 3A and 3B illustrate optical microscope images of well-defined single-walled carbon nanotube patterns deposited using the above-described process. The images illustrate that line-width as small as 10 $\mu$m can be obtained using the described "dip-coating" process. The line-width of the single-walled carbon nanotube stripes shown in FIG. 3A are 100 $\mu$m, 40 $\mu$m, and 10 $\mu$m, respectively. The shadows shown in FIG. 3A can be the result of reflections from the surface underneath the glass substrate while the images were taken. The single-walled carbon nanotube films were obtained at a deposition rate of about 1 cm/day. At present, it is believed that the line-width is limited by the resolution of the printed polymer photo-mask, rather than by the deposition method. The single-walled carbon nanotube stripes exhibit stepwise, sharp edges at the interfaces, and are smooth and continuous. The electrical conductivity of the self-assembled film deposited on an insulating surface was measured to be 0.2 S/cm at room temperature. For comparison, the conductivity of comparable "freestanding" single-walled carbon nanotube membranes have been shown to be about 0.3 S/cm.

Film thickness and uniformity can depend on the concentration of the suspension and on the rate at which the substrate is withdrawn from the suspension or the evaporation rate of the suspension. Relatively thick films can be obtained using high suspension concentrations (for example, about 1.0 g/L) and at lower withdrawal/evaporation rates. When the suspension comprises water, the thickness of the single-walled carbon nanotube film can decrease with increasing temperature. The film can become discontinuous when the temperature is raised above about 40° C. Similar discontinuities can be observed when water is replaced in the suspension by fast-evaporating solvents, such as ethyl alcohol. Temperature fluctuation during deposition can also result in variations in the film thickness, believed to be the result of changes in the solvent evaporation rate. Moreover, films comprising shorted single-walled carbon nanotubes can be more uniform than those comprising longer tubes, which is believed to be related to a difference in the quality/stability of the suspension. In certain cases, streaks running parallel to the deposition direction can be observed on the deposited film. This is believed to be attributed to an instability of receding fluid at the triple-interface.

Figure 4:
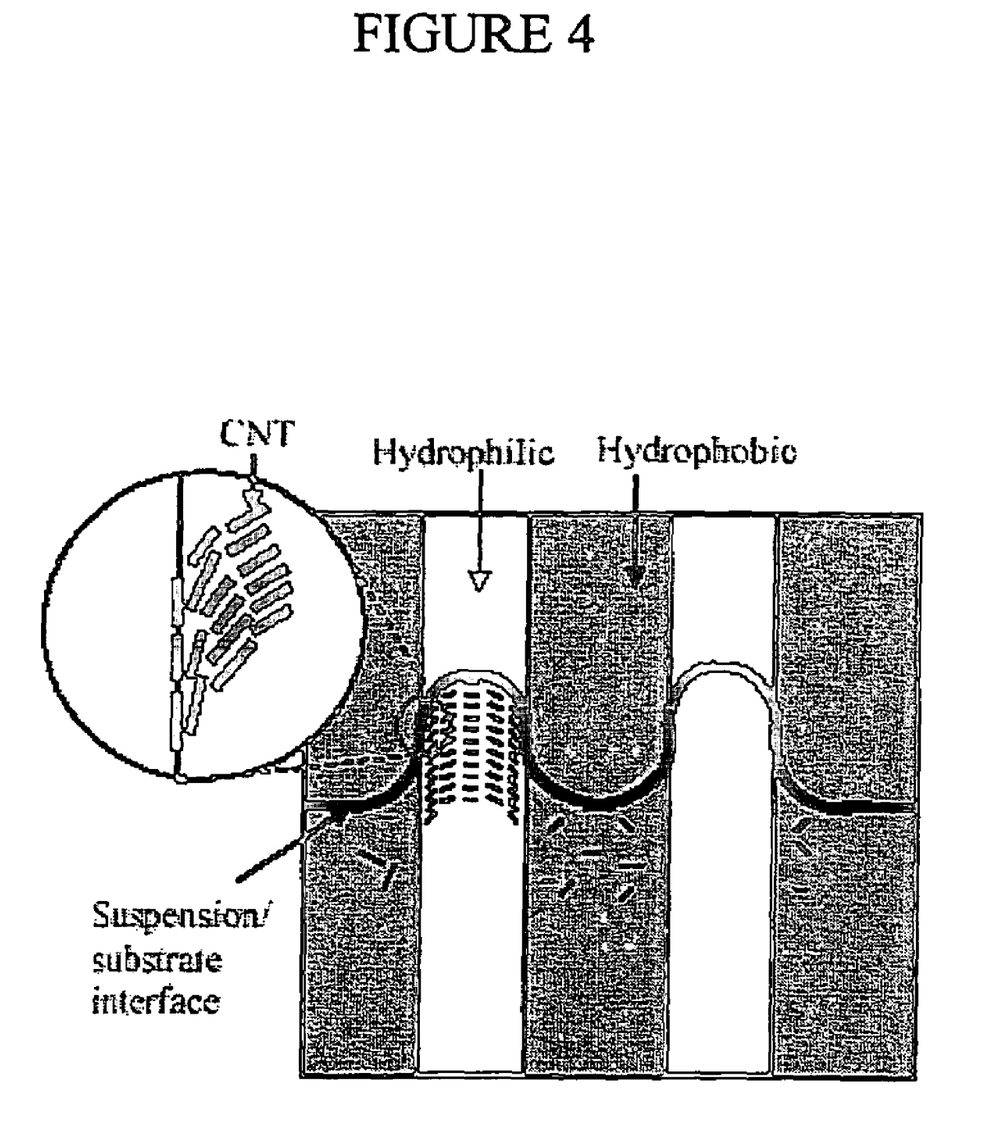
FIG. 4 illustrates a gradual change in the orientation carbon nanotubes deposited on a patterned substrate according to an exemplary embodiment.

Similar to carbon nanotube films assembled on chemically homogeneous structures reported previously, the single-walled carbon nanotube bundles deposited within each stripe are aligned "in-plane" along the water/substrate/ air triple-line direction. For the patterned substrate, the triple-line can change from parallel to the deposition direction, at the interface between the hydrophobic and hydrophilic region, to perpendicular to the deposition direction in the middle of the hydrophilic region for each strip, as illustrated in FIG. 4. As a result, the orientation of the single-walled carbon nanotube bundles can change gradually from parallel to perpendicular to the deposition direction between the edge and the middle-point of each stripe. This can be confirmed by obtaining TEM images of the single-walled carbon nanotube film that have been removed from the substrate. The overall orientation of the single-walled carbon nanotubes can depend on the width of the stripes. For relatively large stripes, for example stripes of about 100 $\mu$m, the preferred direction is perpendicular to the deposition direction.

The self-assembly methods described above can be used to fabricate field emission cathodes for use in a variety of applications, such as lighting elements, field emission devices such as flat panel displays, gas discharge tubes for over voltage protection, x-ray generating devices, small conduction wires, sensors, actuators and high resolution probes such as those used in scanning microscopes. The nanostructure-containing emissive material fabricated using the self-assembly techniques described here produce field emission devices that offer advantages over devices produces by other methods, such as screen printing or electrophoresis. For example, the paste used to produce field emission devices using screen printing techniques can include impurities that can limit the density of emitters in the device and degrade performance. Moreover, the feature sizes of emission structures produced by screen printing can be much larger than those produced using the self-assembly techniques described here. In addition, field emission devices produced by electrophoresis must be produced on electrically conducting substrates. The substrates used with the self-assembly techniques described here can be electrically conducting or insulation depending on the application requirements.

Figure 5:
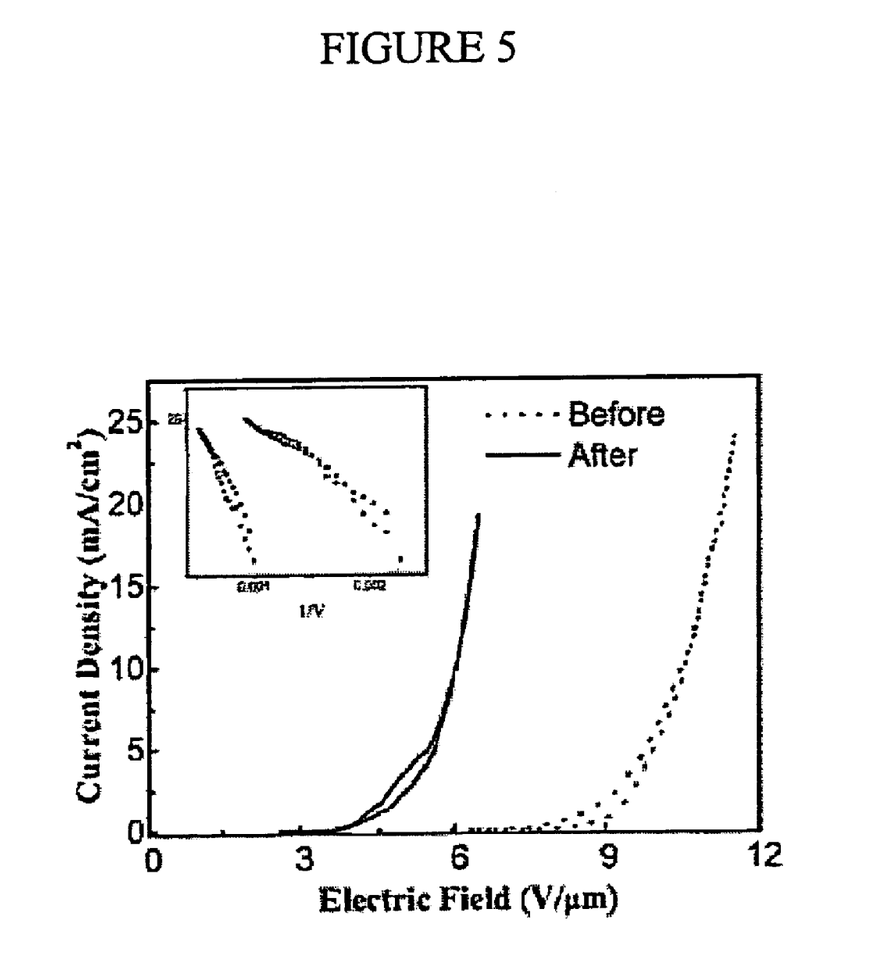
FIG. 5 illustrates the field emission characteristics of a film comprising carbon nanotubes deposited according to an exemplary embodiment.

The electron field emission characteristics of such self-assembled single-walled carbon nanotube films can be measured in a vacuum chamber, for example, at 5×10$^{-7}$ Torr base pressure. To provide electrical contact to the single-walled carbon nanotubes, two chromium strips can be evaporated on the edges of the single-walled carbon nanotube stripes. FIG. 5 shows the emission current-voltage (I–V) characteristics of a patterned film (100 $\mu$m line width, 300 $\mu$m pitch) deposited with 5 $\mu$m-length single-walled carbon nanotube bundles. The graphs shown in the inset is the Fowler-Nordheim plot for the same data. The data can be collected using a hemispherical tip (for example, having a 5 mm radius) as the anode, and a cathode-to-anode spacing of about 168 $\mu$m. In the first measurement shown, the threshold electric field needed to yield a 10 mA/cm$^2$ current density can be about 11 V/$\mu$m.

The threshold electric field can be further substantially reduced using an electrical conditioning process. For example, the threshold field can be lowered by about 6 V/$\mu$m after the treatment (see the solid line plot in the figure). Such threshold electric field values are comparable to previously reported threshold fields of 4–7 V/$\mu$m for 10 A/cm$^2$ with free-standing membranes of long single-walled carbon nanotube bundles.

In self-assembled cathodes fabricated using the above-described methods, the single-walled carbon nanotubes can be aligned in-plane on the surface of the substrates. Similar to field-induced alignment of an isolated single-walled carbon nanotube, it is believed that when the applied electric field is made sufficiently large, the single-walled carbon nanotube bundles first bend and protrude along a direction of the field, then emit electrons from their tips. As a result, the threshold field can depend on both the aspect ratio of the nanotubes and the interaction between the carbon nanotubes and the substrate. An activation process is believed to remove the so-called "hot" spots on the cathode, and to make it easier for the nanotubes to protrude along the field direction to reduce the threshold field. Activation processes can include removing excess material from the surface of the substrate after deposition, for example using sonication and/or mechanical removal techniques.

The electron field emission characteristics of self-assembled structures fabricated according to the above-described methods can compare favorably with structures fabricated using CVD-grown carbon nanotubes, as well as cathodes fabricated using screen-printing methods. Emission cathodes having a much higher pixel resolution can be obtained using a self-assembly process, such as those described here, than what can be obtained using so-called "thick-film" techniques. Moreover, the self-assembly process can be used to obtain similar results from depositing both single-walled and multi-walled carbon nanotubes on a variety of substrates, including silicon, glass, ITO-coated glass, aluminum, and chromium. Assembly and integration of nanostructured materials for device applications including the field emission displays can be achieved using the described self-assembly methods.

After deposition of the nanostructure-containing material using the self-assembly process described above, the coated substrate can be subjected to further processing, such as annealing. For example, the coated substrate can be annealed to remove remnants of the liquid medium following withdrawal of the substrate from or evaporation of the suspension to improve the electrical and thermal properties of the nanostructure-containing material, and to improve the bonding between the material layer and the substrate. According to an exemplary embodiment, the coated substrate can be heated to a temperature of about 100° C.–1200° C. for approximately 1 hour, then further annealed at a temperature of about 800° C. for approximately 2 hours. Both anneals can occur at a vacuum pressure of about 5×10$^{-7}$ Torr.

A number of specific illustrative examples consistent with the principles of the present invention will now be described. These examples are intended as illustrative, and should not be consider restrictive in any way.

EXAMPLE 1

Deposition of Carbon Nanotube Films on Glass

Substrates comprising glass in various sizes and thickness can first be cleaned to eliminate organic dirt and to restore the hydrophilic properties of the glass surfaces. One example of a cleaning method can be to sonicate the glass substrates in a sonication bath using solvents, such as acetone, alcohol, or de-ionized water. After sonication, the glass substrates can be blow-dried using filtered nitrogen gas. The substrates can be subjected to further cleaning using other methods, such as "Piranha" solution cleaning, in which the substrate is exposed for about 30 minutes in an approximate 4:1 ratio of concentrated sulfuric acid and 30% H$_2$O$_2$. In addition, the substrates can be cleaned using a UV-Ozone cleaning method, in which the substrates are exposed to UV light in oxygen environment for about 30 minutes. The thoroughly cleaned glass surfaces can be terminated with Hydroxyl (—OH) groups that can form chemical bonds with carboxylic groups attached to the carbon nanotubes.

Figure 6:
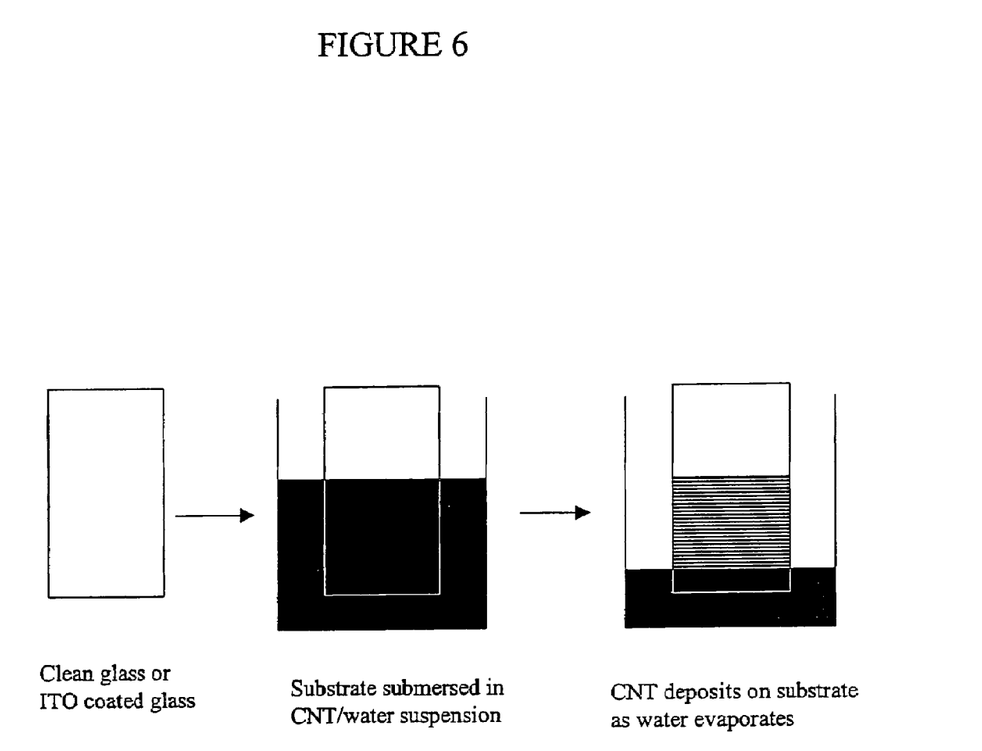
FIG. 6 illustrates a method for depositing a film of nanostructure-containing material, such as carbon nanotubes, onto a glass or an indium-tin-oxide-coated (ITO-coated) glass substrate according to a first exemplary embodiment.

One method to transfer the carbon nanotubes onto the glass surface is to immerse the cleaned substrate into a suspension of carbon nanotubes and water at room temperature. The concentration of the carbon nanotube/water suspension can be in the range of about 0.0001–1 gram of nanotubes per litre of water. The concentration of raw material in the liquid medium can be varied, so long as a stable suspension can be maintained. The nanotubes can assemble on the hydrophilic surface of the glass. As the triple-line moves downward as water gradually evaporates from the substrate surface or as the substrate is gradually withdrawn from the suspension, a continuous carbon nanotube film forms of the surface of the substrate. A process consistent with the above is illustrated in FIG. 6.

The thickness of the film can be controlled by various process factors, including the rate at which the substrate is removed from the liquid or water evaporates from the substrate surface, and the concentration of the suspension. The film can be as thin as a mono-layer of carbon nanotubes or can include single-walled carbon nanotube bundles as thick as a few microns. After deposition, the film can be annealed to remove the solvent included in the suspension. Under certain deposition conditions, the carbon nanotubes deposited on the substrates can be partially aligned in the direction parallel to the triple-line direction.

Other methods to bring the carbon nanotubes into contact with the suspension to deposit the nanotubes of the glass substrates can include means such as spin-coating and spraying tools, electrophoresis apparatus, and printing, casting, and dropping tools. One example of a printing process includes first placing the suspension containing the carbon nanotubes on one end of the substrate surface. The suspension can then be moved across the surface of the substrate. As the suspension is moved across the surface of the substrate, the carbon nanotubes precipitate from the suspension and are deposited on the substrate surface.

EXAMPLE 2

Deposition of Patterned Carbon Nanotube Structures on Glass

Cleaned glass substrates can be covered with a hydrophobic film. Examples of suitable hydrophobic films include photo-patternable viscous polymers, such as photoresist (Shipley 1813), and a self-assembled monolayer of organosilanes having a hydrophobic end-group termination, such as an ethyl-group-terminated organosilanes such as OTS. In a subsequent step, the hydrophobic film can be removed from an area of the glass surface where the carbon nanotube film is to be deposited. The methods utilized to produce the patterned templates include UV light photolithography, e-beam lithography, and UV-Ozone treatment (as described in Example 1 above).

The carbon nanotubes can be deposited on the surface of the glass substrate including the patterned hydrophobic film by a suitable technique, such as the self-assembly described above, spin-coating, spraying, electrophoresis, printing, casting, and dropping. According to one particular example, the deposition can be carried out by immersing at least a portion of the glass substrate into a suspension of carbon nanotubes and water at room temperature. The nanotubes assemble preferably on the hydrophilic regions of the glass.

As the triple-line moves downward when the water gradually evaporates or the substrate is gradually withdrawn from the suspension, a continuous carbon nanotube film forms on the hydrophilic region of the patterned substrate.

After the deposition, the hydrophobic coating can be removed. When the hydrophobic coating is photoresist, the photoresist can be removed by first annealing the coated substrate at a relatively low temperature, for example at about 100° C., for approximately 2 minutes to remove any moisture remaining on the substrate. Next, the photoresist can be removed by applying acetone to resist and/or by placing the substrate in a sonic bath of acetone for about 5 minutes. Because of the strong adherence of the carbon nanotubes to the substrate, the carbon nanotube film remains adhered to the hydrophilic region of the substrate.

Figure 7:
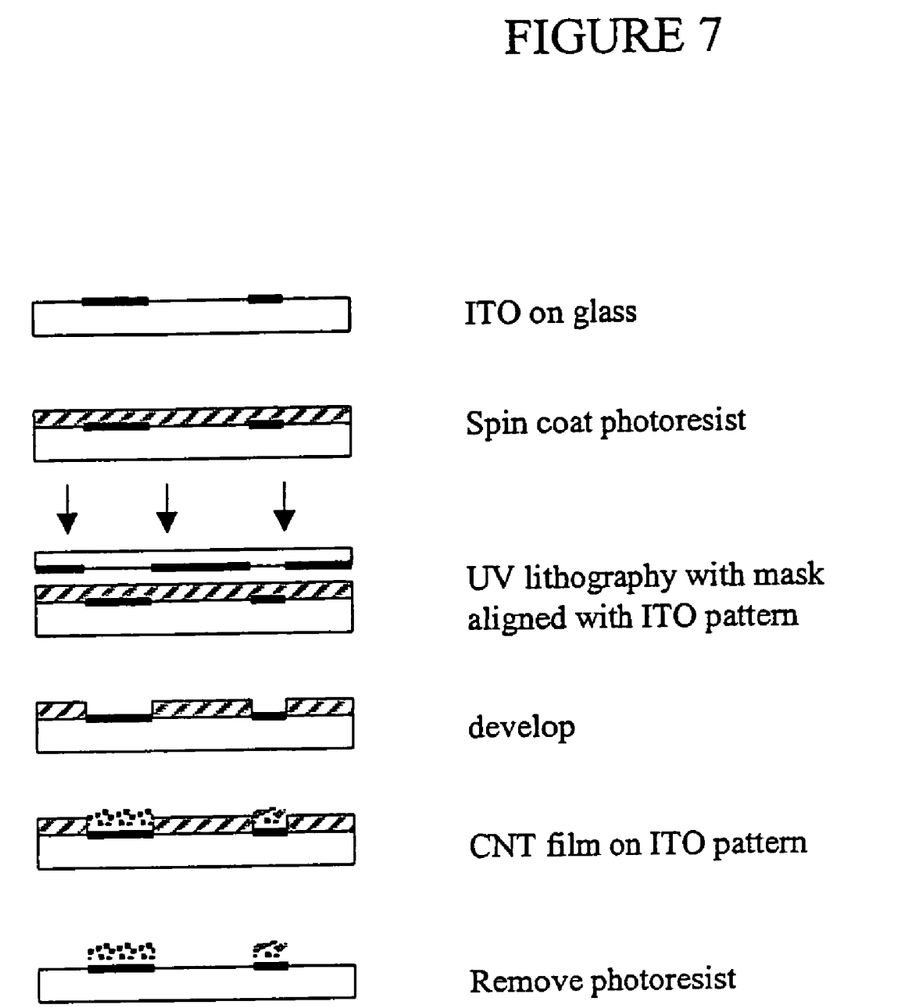
FIG. 7 illustrates a method for depositing a film of nanostructure-containing material, such as carbon nanotubes, onto a glass or an ITO-coated glass substrate according to a second exemplary embodiment.
Figure 8:
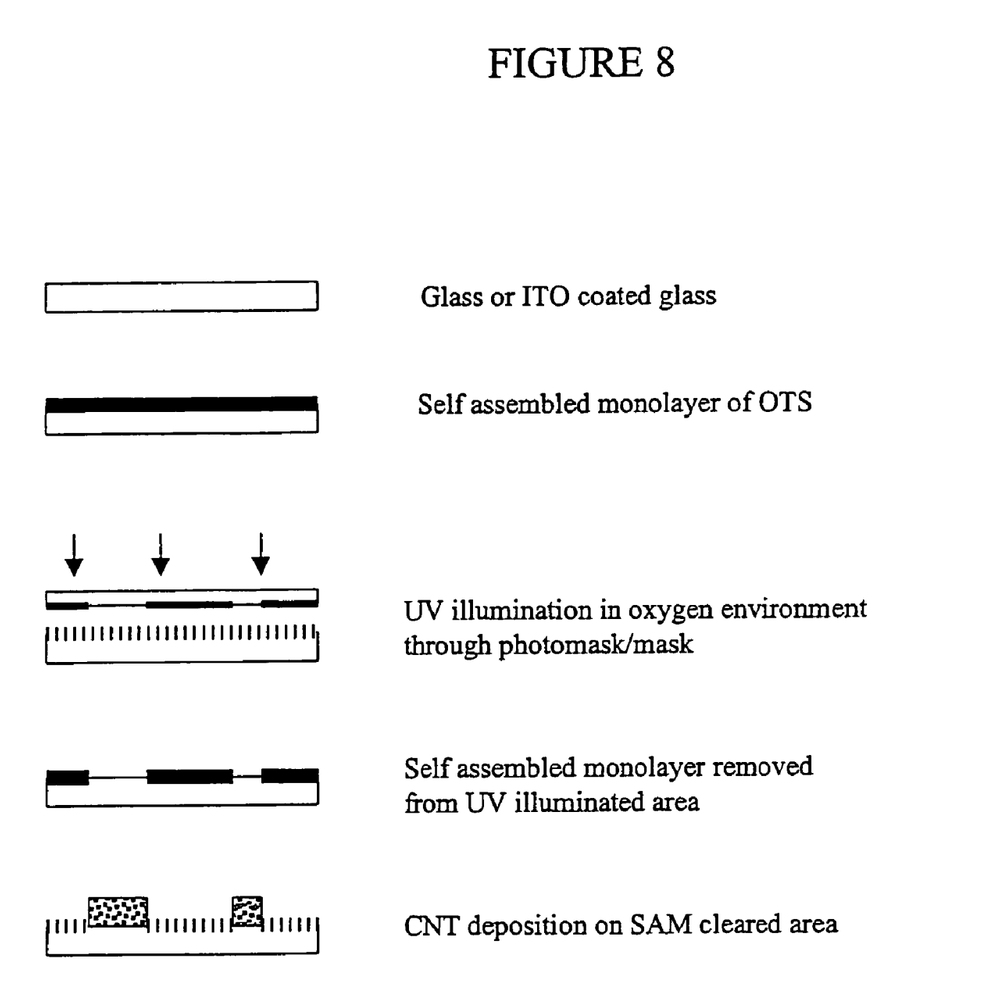
FIG. 8 illustrates a method for depositing a film of nanostructure-containing material, such as carbon nanotubes, onto a glass or an ITO-coated glass substrate according to a third exemplary embodiment.

Processes performed consistent with the above process are illustrated in FIGS. 7 and 8.

EXAMPLE 3

Deposition of Patterned Carbon Nanotube Structures on ITO/Glass Substrates

Glass substrates can be patterned with an ITO coating using alignment marks. The ITO-patterned substrates can be cleaned, for example, using a series of sonication baths of acetone, alcohol, and de-ionized water, followed the by a UV-Ozone treatment (described in conjunction with Example 1 above). A photo-patternable hydrophobic film can then be added to a surface of the cleaned ITO glass. For example, photoresist (Shipley 1813) or a self-assembled monolayer of organosilanes can be added to the surface as described above. The pattern of ITO on the glass surface can then be used to align a photo mask for patterning the hydrophobic film. UV photolithography can be performed in the usual manner, and the hydrophobic film can be removed from the ITO area of the substrate. Carbon nanotubes can be suspended in a liquid medium, and can be deposited on the substrate using any one of the methods disclosed in Examples 1 and 2. The hydrophobic coating can be removed by the processes disclosed in Example 2.

Figure 9:
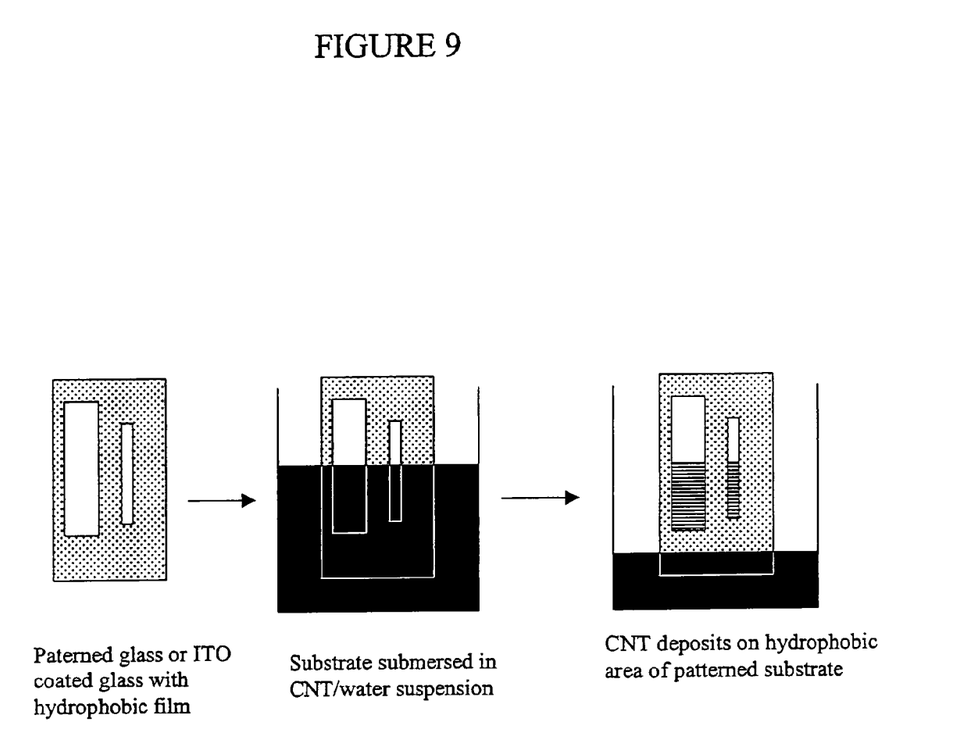
FIG. 9 illustrates a method for depositing a film of nanostructure-containing material, such as carbon nanotubes, onto a glass or an ITO-coated glass substrate according to an exemplary embodiment.

A process consistent with the above is illustrated in FIG. 9.

EXAMPLE 4

Using Photoresist as the Template for Patterned Deposition of Carbon Nanotubes

A Photosensitive polymer in viscous liquid type (for example Shipley 1813 photoresist) can be applied to a clean surface of a glass substrate or a glass substrate coated with ITO. The substrate can then be subjected to standard photolithography procedures to transfer a pattern included on photo tools to the coated photoresist film. The Photo tools used can include a chrome photo mask on sodalime glass plates, or can be a polymer film printed on the substrate using high-resolution printers.

The substrate with patterned photoresist film can then deposited with carbon nanotubes. According to an exemplary embodiment, the substrate can be immersed in a suspension of carbon nanotubes and water at room temperature. The nanotubes assemble along the water/substrate/air triple-line, preferably on a hydrophilic area of glass not covered by the photoresist. As the triple-line moves downward when the water gradually evaporates or when the substrate is gradually withdrawn from the suspension, a continuous patterned carbon nanotube film forms in the hydrophilic region of the substrate.

After deposition, the substrate can be annealed by placed it on a hotplate at a temperature of about 100° C. for approximately 2 minutes to remove any remaining moisture. The photoresist coating can then be removed by applying acetone and/or by placing the substrate in a sonic bath of acetone for about 5 minutes. Again, because of strong adherence of the carbon nanotubes to the substrate, the carbon nanotube film remains adhered the substrate following removal of the resist.

EXAMPLE 5

Using a Self-Assembled Monolayer as a Template for Patterned Deposition of Carbon Nanotubes A self-assembled monolayer of silane molecules having a hydrophobic function group can be formed on a surface of clean glass or and ITO-coated substrate by solution phase or vapor phase reaction (processes referred to as Silanization). One example of a solution phase silanization process can include immersing the clean glass or ITO-coated glass substrate in a dilute OTS solution (for example, about 1 mM OTS in a mixed solvent of hexadecane and tetrachlorocarbon at an approximate 4:1 ratio) with substantially constant agitation in a dry condition (for example, a dry box flushed with filtered nitrogen for about 30 minutes results in an approximate 5% humidity or less environment). An example of a vapor phase silanization process can include sealing the cleaned glass or ITO-coated glass substrate in a glass container (for example, a glass desicator) with about 1 mL of concentrated OTS for approximately 12 hours. Afterwards, the substrate can be cleaned in sonic baths of chloroform and ethyl alcohol for about 5 minutes each before drying. As the silanized glass or ITO-coated glass substrates are exposed to UV light in atmosphere through, for example, a chrome photo mask (patterned chrome film on sodalime glass plate) or a physical mask (a laser cut stencil mask), the exposed portions of the substrates are rendered hydrophilic via oxidation.

Alternatively, clean glass or ITO-coated glass substrates can be coated with photoresist and subjected to UV light photolithography using a photo mask with an inverse pattern (or a negative photoresist can be used). The substrate patterned with photoresist can be sealed with about 1 mM concentrated OTS in a glass desiccator for approximately 12 hours. The substrate can then be rinsed with ethyl alcohol or with acetone to dissolve photoresist coating. The substrate can then be cleaned in sonic baths of ethyl alcohol and de-ionized water for about 5 minutes, respectively. The areas where the photoresist is removed forms the hydrophilic region of substrate suitable for deposition of the carbon nanotubes.

Carbon nanotubes can then be deposited at room temperature on the glass or ITO-coated glass substrate having the patterned self-assembled monolayer of organosilanes using any of the deposition methods disclosed in conjunction with Examples 1 and 2.

EXAMPLE 6

Depositing Amine or Other Functional Groups to Increase the Interfacial Bonding Between the Carbon Nanotubes and the Substrate Glass or ITO-coated glass substrates can be cleaned to form hydroxyl terminations on the surface of the substrates. For example, the substrates can be subjected to sonic baths of organic solvents, followed by UV-Ozone treatment and/or Piranha solution cleaning as described above. The substrates can then be functionalized using organosilanes having amine end-group termination, such as aminopropyltriethoxysilane. One example of amine group functionalization includes maintaining the substrate in about a 1 wt % aminopropyltriethoxysilane solution in anhydrous toluene at about 60° C. for approximately 5 minutes. The substrate is then rinsed with toluene and ethyl alcohol, and then placed in a sonic bath of ethyl alcohol for about 5 minutes.

Carbon nanotubes can then be deposited on the glass or ITO-coated glass substrate having a patterned self-assembled monolayer of organosilanes using any of the deposition methods disclosed in Examples 1 and 2 at room temperature.

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A self-assembly method for depositing nanostructure-containing materials, the method comprising:
forming a nanostructure-containing material;
chemically functionalizing the nanostructure-containing material;
dispersing the functionalized nanostructure-containing material in a liquid medium to form a suspension;
bringing at least a portion of a substrate having a surface that can attract the functionalized nanostructure-containing material into contact with the suspension; and
separating the substrate from the suspension, wherein the nanostructure-containing material adheres to the portion of the substrate when separated from the suspension.

2. The method of claim 1, comprising:
forming hydrophilic and hydrophobic regions on the surface of the substrate before bringing the substrate into contact with the suspension, wherein the functionalized nanostructure-containing material is hydrophilic and adheres to the hydrophilic region of the substrate when separated from the suspension.

3. The method of claim 2, wherein forming hydrophilic and hydrophobic regions comprises:
forming on a surface of the substrate a self-assembled monolayer of organosilanes having a hydrophobic end-group termination; and
exposing a portion of the self-assembled monolayer to ultraviolet (UV) light in an oxygen environment; wherein the exposed portion of the self-assembled monolayer forms the hydrophilic region of the substrate and the remaining portion of the self-assembled monolayer forms the hydrophobic region of the substrate.

4. The method of claim 2, wherein forming hydrophilic and hydrophobic regions comprises:
depositing hydrophobic photoresist on the surface of the substrate;
exposing a portion of the photoresist to ultraviolet (UV) light; and
removing a portion of the photoresist to expose the hydrophilic region of the substrate, wherein the remaining photoresist forms the hydrophobic region of the substrate.

5. The method of claim 4, comprising:
applying a solvent to the substrate to remove the hydrophobic photoresist after separating the substrate from the suspension, wherein the nanostructure-containing material remains adhered to the substrate after applying the solvent.

6. The method of claim 5, comprising:
annealing the substrate prior to removing the hydrophobic photoresist.

7. The method of claim 2, wherein when the substrate comprises glass, the method comprises:
functionalizing a portion of the surface of the glass substrate corresponding to the hydrophilic region of the substrate with organosilanes having an anime end-group termination.

8. The method of claim 1, comprising:
annealing the substrate after separation from the suspension.

9. The method of claim 1, comprising:
removing excess nanostructure-containing material from the substrate after separation from the suspension.

10. The method of claim 1, comprising:
cleaning the substrate prior to bringing the portion into contact with the suspension.

11. The method of claim 10, wherein when the substrate comprises glass, cleaning the substrate comprises at least one of:
placing the substrate into a sonication bath with a solvent;
subjecting the substrate to a mixture of sulfuric acid and hydrogen peroxide; and
exposing the substrate to ultraviolet (UV) light in an oxygen environment.

12. The method of claim 1, wherein bringing the substrate into contact with the suspension comprises:
immersing the substrate in the nanostructure-containing suspension.

13. The method of claim 12, wherein separating the substrate from the suspension comprises at least one of:
withdrawing the immersed substrate from the suspension; and
evaporating the suspension while the substrate is immersed.

14. The method of claim 1, wherein bringing the substrate into contact with the suspension comprises:
arranging the suspension on a portion of the surface of the substrate; and
moving the suspension across the surface of the substrate, wherein the nanostructure-containing material dispersed in the suspension adheres to the surface that can attract the functionalized material.

15. The method of claim 1, wherein bringing the substrate into contact with the suspension comprises at least one of spin-coating and spraying the nanostructure-containing suspension onto the substrate.

16. The method of claim 1, wherein the liquid medium comprises water to form an aqueous nanostructure-containing suspension.

17. The method of claim 1, wherein a concentration of material included in the suspension is between about 0.0001 to 1 gram of nanostructure-containing material per liter of liquid medium.

18. The method of claim 1, wherein the nanostructure-containing material comprises at least one of
single-walled carbon nanotubes, multi-walled carbon nanotubes, silicon, silicon oxide, germanium, germanium oxide, carbon nitrides, boron, boron nitride, dichalcogenide, silver, gold, iron, titanium oxide, gallium oxide, indium phosphide, and magnetic particles including at least one Fe, Co, and Ni enclosed within nanostructures.

19. The method of claim 1, wherein chemically functionalizing the nanostructure-containing material comprises:
partially oxidizing the nanostructure-containing material by reaction with an acid.

20. The method of claim 1, wherein the substrate comprises at least one of silicon, glass, indium-tin-oxide (ITO) coated glass, a metal, metal-coated glass, a plastic, and a ceramic.

21. The method of claim 1, wherein the nanostructure-containing material adhered to the substrate is substantially aligned in one direction.

22. A method of fabricating a patterned carbon nanotube field emission cathode by self-assembly, the method comprising:
forming a material comprising carbon nanotubes;
chemically functionalizing the carbon nanotubes;
dispersing the material comprising the functionalized carbon nanotubes in a liquid medium to form a suspension;
forming hydrophilic and hydrophobic regions on a surface of a substrate that can attract the functionalized carbon-nanotubes;
bringing at least a portion of the substrate into contact with the suspension; and
separating the substrate from the suspension, wherein the carbon nanotubes adhere to the hydrophilic region of the substrate when separated from the suspension.

23. The method of claim 22, comprising:
annealing the substrate after separation from the suspension; and
removing excess carbon nanotubes from the substrate after separation from the suspension.

24. The method of claim 22, wherein chemically functionalizing the carbon nanotubes comprises:
partially oxidizing the carbon nanotubes by reaction with an acid.

25. A field emission cathode produced in accordance with the method of claim 1.

26. A field emission cathode produced in accordance with the method of claim 22.

27. An apparatus for depositing nanostructure-containing materials on a substrate, the apparatus comprising:
means for forming a nanostructure-containing material;
means for chemically functionalizing the nanostructure-containing material;
means for dispersing the functionalized nanostructure-containing material in a liquid medium to form a suspension;
means for bringing at least a portion of the substrate having a surface that can attract the functionalized nanostructure-containing material into contact with the suspension; and
means for separating the substrate from the suspension, wherein the nanostructure-containing material adheres to the portion of the substrate when separated from the suspension.

28. The apparatus of claim 27, comprising:
means for forming hydrophilic and hydrophobic regions on the surface of the substrate before bringing the substrate into contact with the suspension, wherein the functionalized nanostructure-containing material is hydrophilic and adheres to the hydrophilic region of the substrate when separated from the suspension.

* * * * *